United States Patent [19]

Chaloux, Jr. et al.

[11] Patent Number: 4,721,689

[45] Date of Patent: Jan. 26, 1988

[54] METHOD FOR SIMULTANEOUSLY FORMING AN INTERCONNECTION LEVEL AND VIA STUDS

[75] Inventors: Paul N. Chaloux, Jr., Wappingers Falls; Thomas F. Houghton, Beacon; Richard K. West, Poughkeepsie, all of N.Y.

[73] Assignee: International Business Machines Corporation, Armonk, N.Y.

[21] Appl. No.: 901,492

[22] Filed: Aug. 28, 1986

[51] Int. Cl.$^4$ .................. C23F 1/02; C03C 15/00; C03C 25/06

[52] U.S. Cl. ........................... 437/189; 437/198; 437/228; 437/245; 437/51; 204/192.11

[58] Field of Search ............ 29/571, 591, 578, 577 C, 29/589; 148/DIG. 131, DIG. 158, 1.5; 204/192.11, 192.12; 42/88; 357/49, 45, 71; 156/643

[56] References Cited

U.S. PATENT DOCUMENTS

| | | | |
|---|---|---|---|
| 3,976,524 | 8/1976 | Feng | 204/192 |
| 4,057,476 | 11/1977 | Krikorian et al. | 204/192.11 |
| 4,089,766 | 5/1978 | Paal et al. | 204/192 |
| 4,107,726 | 8/1978 | Schilling | 357/71 |
| 4,184,909 | 1/1980 | Chang et al. | 156/643 |
| 4,305,801 | 12/1981 | Patten et al. | 204/192.12 |
| 4,396,458 | 8/1983 | Platter et al. | 156/643 |
| 4,430,365 | 2/1984 | Schaible et al. | 427/96 |
| 4,451,326 | 5/1984 | Gwozdz | 156/643 |
| 4,470,874 | 9/1984 | Bartush et al. | 156/643 |
| 4,486,946 | 12/1984 | Jopke, Jr. et al. | 29/571 |
| 4,523,372 | 6/1985 | Balda et al. | 29/590 |
| 4,541,169 | 9/1985 | Bartush | 29/591 |
| 4,556,897 | 12/1985 | Yorikane | 357/71 |
| 4,582,563 | 4/1986 | Hazuki | 204/192 |

OTHER PUBLICATIONS

Smith, "The Influence of Bias Sputtering and Wafer Preheating on Step Coverage of Sputtered Aluminium," Thin Solid Films 96–Oct. -1982, 291–299.

Denison, "Copper Distribution of Sputtered Al/Cu Films," J. Vac. Sci. Technology, 17(6), Nov./Dec. 1980, pp. 1326-1330.

Dudley, "A Survey of Vacuum Deposition Technology" SCP and Solid State Technology, Dec. 1967, pp.39–44.

Thornston, "Influence of Substrate Temperature and Deposition Rate on Structure of Thick Sputtered Cu Coatings" J. Vac. Science. Techn., vol. 12, No. 4, Jul.-/Aug. 75, pp. 830–835.

Christensen, "Characteristics and Applications of Bias Sputtering", Solid State Technology, Dec. 1970, pp. 38–45.

Davidse, "Increasing Effectiveness of Bias Sputtering", IBM Tech. Disclosure Bulletin, vol. 8, No. 12, May 66, p. 1704.

Bialko, "Reducing Interlevel Shorts in Sputtered Insulators", IBM TDB, vol. 20, No. 1, Jun. 77, pp. 149–150.

*Primary Examiner*—Brian E. Hearn
*Assistant Examiner*—Tom Thomas
*Attorney, Agent, or Firm*—William T. Ellis

[57] ABSTRACT

A method for simultaneously forming a level of interconnection metallurgy over, and inter-level via studs through, an insulating layer of a semiconductor chip. The method comprises the steps of forming a plurality of via holes in the insulating layer, high-mobility sputtering conductive material on to the surface of the insulating layer and into the via holes therein, masking the conductive material layer, and then ion beam milling through the mask to form a patterned interconnection layer. The high-mobility sputtering step is accomplished by reducing the background pressure to below $10^{-7}$ Torr to eliminate non-mobile species, maintaining a sputter pressure of less than 7 microns, maintaining an appropriate chip bias level to keep the conductive material molecules mobile until they reach their lowest energy state, and maintaining the temperature of the chip at a level so that a high sputter species mobility is maintained. This high-mobility sputtering forms a substantially planar conductive layer and fills the via holes without void formation. The foregoing process permits extremely dense interconnection levels, is especially suited for multiple interconnection level designs, and is extendable to large diameter wafer fabrication.

15 Claims, 12 Drawing Figures

METHOD FOR SIMULTANEOUSLY FORMING AN INTERCONNECTION LEVEL AND VIA STUDS

BACKGROUND OF INVENTION

The present invention relates generally to the manufacture of high performance VLSI semiconductor chips, and more particularly to a method of manufacturing a plurality of levels of interconnection metallurgy for personalizing such semiconductor chips.

A semiconductor chip comprises an array of devices whose contacts are interconnected by patterns of conductive wires. As the density of devices fabricated on a given chip increases, problems arise in providing interconnections between the various devices. In order to take full advantage of the device and circuit density on a given chip, it is necessary to make interconnections among the various devices and circuit elements in the chip in a high density manner. However, due to the level of integration of devices and circuits on a chip, interconnections can no longer be made by means of a single level network of conductive lines. Instead, it is necessary to provide at least two, and preferably three or more conductor interconnection levels, with each interconnection level separated by an insulating layer. Connections are made between these different interconnection pattern levels by means of via holes which are etched through the insulating layers separating these levels and which are filled with metal to form studs. These multiple levels of conductor wiring interconnection patterns, with the individual levels connected by conductor studs, operate to distribute signals among the circuits on the chip.

Prior art multilevel interconnect systems generally utilize a straight-forward approach of photoresist patterning and etching operations to construct successive layers of insulating material and conducting material (metal) to form a personalized interconnect system. However, because of process related design constraints inherently involved in this fabrication process, the multilevel interconnect systems which can be produced are greatly limited in their overall density of interconnections.

In particular, conductive interconnection lines for a given interconnection level and interlevel via studs currently are separately formed by means of metal evaporation through a liftoff stencil. Generally, spaced pedestals with overhangs are utilized to form the liftoff stencil. When metal is evaporated into the spaces between the various pedestals, the pedestal overhangs insure that the area directly below the overhangs remains free of metal. The evaporated layer is then immersed in a solvent which attacks the pedestal through the metal-free areas between the base of the pedestals and the evaporated metal to thereby effect the pedestal removal, while leaving the metal stud or line.

However, evaporated metal is very conformal. The conformal nature of this evaporation causes significant dips in the evaporated layer over the via holes due to the evaporated layer following the topography of the hole. The resulting lack of planarity for the evaporated metal layer causes tolerance problems in later processing steps because the tops of the interconnection lines and the via studs are now at different levels. This tolerance problem is exaccerbated as the number of interconnection layers increases. Additionally, if the via holes have sharp edges, then weak points subject to breakage occur in the conformal layer at these edges. To solve this problem, the via hole edges must be rounded. However, such via edge rounding increases the area of the via hole at the surface of the insulating layer in which it is disposed. The resulting via-hole area-increase causes a significant decrease in the possible conductor pattern density of the interconnection level disposed over this insulating layer.

An additional problem with this process is that there is no known method for evaporating metal with the sufficiently small angle of incidence that is necessary to effect liftoff from substrate layers greater than 12 cm in diameter. The use of evaporation techniques on such large diameter substrates results in metal deposits under the pedestal overhangs, thereby preventing pedestal removal and causing short circuits.

A further problem with the evaporated metal technique is that it is difficult to properly form an insulating layer in high aspect ratio (height/width ratio) spaces between adjacent studs or lines after the stencil pedestal has been removed. As the space between adjacent 2-3 micron high studs or lines drops below 2 microns, this insulation problem becomes especially acute.

Sputtering is an alternative technique for depositing a conductive layer. However, sputtering is not indicated for forming patterns through a liftoff stencil as described above because the sputtered metal coats and adheres to the sidewalls of the pedestal and the pedestal overhang used to form the studs and interconnection lines. The adherence of the metal to the sidewalls of the pedestals below the pedestal overhang prevents chemical solvents from reaching the pedestal to effect its removal. Sputtering, as previously practiced, is also not indicated for filling deep, vertical walled vias because of its tendency to adhere and accumulate to the via sidewalls. Accordingly, as the metal coating increases in thickness on these sidewalls, the metal coatings on opposing overhangs join together, leaving an unfilled void in the space between the pedestals.

Although sputtering is not indicated for filling via holes, it may be possible to use sputtering to form the interconnection level lines. Such a technique would comprise the sputtering of a layer of metal over a given insulation layer, followed by the removal of selected portions of the sputtered layer to define various metal lines. This metal removal can be effected via either a wet etch process, or by means of a reactive ion etching process. However, the wet etch process is isotropic in nature, and thus cannot be used for dense pattern applications. RIE however, is anisotropic in nature and can be used to form dense conductor patterns if appropriate RIE barriers are first deposited. But, the standard $Cl_2$ gas used in metal RIE is corrosive to the underlying device. Moreover, the RIE etch rate is pattern dependent due to certain RIE by-products formed during the etching process. Thus, close line patterns etch at a different rate than isolated lines on a given chip. Additionally, the standard RIE over-etch required due to the various tolerances involved creates mouseholes in any exposed via studs underlying the overetched region. Finally, there are currently no commercially available RIE etches suitable for etching Al-Cu alloys with more than 2% Cu by weight; the preferred alloys for forming interconnections.

The invention as claimed is intended to remedy the above-described problems in forming dense interconnection patterns.

The advantage offered by the present invention is that a given level of interconnection conductors and the interlevel via studs set therebelow can be formed simultaneously to very tight tolerances. The process used in this formation avoids the planarity problems, the angle of incidence requirements, the rounded via edge requirements, and the stud insulator problems of standard evaporation and liftoff techniques. Likewise, the present process avoids the void formation problem, the pedestal removal problem, and the subtractive etching problem attendant to the use of standard sputtering techniques. This process provides interconnection level planarity and is also extendable to substrates larger than 12 cm in diameter. Additionally, this process can be used to form and fill via holes with high aspect ratios of 1.5 to 1 or greater. Accordingly, this process is especially suited for high density interconnection patterns.

SUMMARY OF INVENTION

Briefly, the present invention comprises a method for forming simultaneously a level of interconnection conductors over and interlevel via studs through an insulating layer of a semiconductor chip, comprising the steps of:

forming a plurality of via holes in a surface of an insulating layer on the semiconductor chip;

sputtering a conductive material onto the surface of the insulating layer and into the via holes and including the steps of substantially eliminating non-mobile sputter species in the vicinity of the surface of the insulating layer, sputtering at a sputter pressure of less than 7 microns, maintaining a chip bias level at a value that is above that needed for planarization of the conductive material but below the bias level where material focusing into the via holes occurs, and maintaining the surface of the insulating layer at a temperature above the temperature where conductive material planarization occurs, but below the temperature where phase changes occur for the conductive material or where device breakdown or hillock growth occurs;

forming a mask over the sputtered surface to define areas of sputtered conductive material to be removed; and directing a particle beam onto the masked surface to remove conductive material from the areas defined by the mask.

In a preferred embodiment, the non-mobile species eliminating step comprises the step of maintaining a background pressure during sputtering that is less than $10^{-7}$ torr. It is also preferred that the step of sputtering be performed at a sputter pressure of less than 5.1 microns. Additionally, it is preferred that the bias level applied to the chip be in the range of $-125$ to $-300$ volts. Finally, where the conductive material to be sputtered is an alloy, it is preferred that the surface temperature of the layer being sputtered be maintained at a temperature in the range of 350° C. to 500° C.

In one embodiment of the present invention, the via hole forming step may comprise the step of forming via holes in an insulating layer of polyimide. In another embodiment of the present invention, the via hole forming step may comprise the step of forming via holes in an insulating layer of planar SiO$_2$.

DETAILED DESCRIPTION OF THE PREFERRED EMBODIMENT

The present invention comprises a method for forming simultaneously a level of interconnection conductors over, and interlevel via studs through, an insulating layer of a semiconductor chip. This method is based on the use of a special planar sputtering to form both the conductive lines at a given level of interconnection and the interlevel via studs simultaneously, in combination with the subtractive etching of the conductive layer by means of a particle beam. This combination of steps permits the formation and the filling of via holes with high aspect ratios and while forming interconnection conductor levels which are planar. Accordingly, this process is specially suited for high density interconnection patterns.

The present process invention will now be described in the context of two embodiments. One embodiment relates to the formation of interconnection layers and studs on an SiO$_2$ insulation layer. The second embodiment relates to the formation of an interconnection layer and studs on a polyimide insulating layer. It should, of course, be noted that the present invention is not restricted to use only with SiO$_2$ or polyimide insulator layers. Rather, the present invention has wide applicability in any context where it is desired to form a level of conductive lines over an insulating layer simultaneously with the filling of via holes in that insulating layer.

The first process embodiment is illustrated in FIGS. 1A–1G, and relates to the formation of an interconnection level metallurgy over, and via studs through an SiO$_2$ insulating layer. In the specific example of FIG. 1, it is desired to form an interconnection level above a set of conductors 10 and 12 disposed on a layer 14 which may be, for example, a semiconductor layer. This interconnection level should be separated from the conductors 10 and 12 by an insulating layer. It is further desired to form conductive via studs from this interconnection level down through this insulating layer to these conductors 10 and 12. The preliminary steps to forming an insulating layer over the conductors 10 and 12 and opening via holes therein down to the conductors 10 and 12 are well known in the art. By way of example, and not by way of limitation, the following steps might be utilized to form the insulating layer and the via holes therethrough.

The first step in forming the insulation layer might comprise cleaning the surface of the layer 14 and the surfaces of the conductors 10 and 12 by means of a standard cleaning rinse. By way of example, isopropyl alcohol might be utilized, followed by a rinse step and a drying step.

Figure 1A:
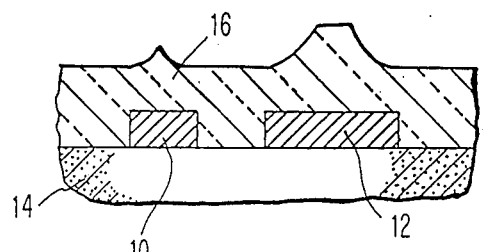
FIGS. 1A–1G comprise schematic cross-sectioned diagrams of SiO$_2$ insulating layer on a semiconductor chip during various stages of the present process.

The next step might comprise depositing planar SiO$_2$ onto the upper surface of the layer 14 and on and around the conductors 10 and 12. This layer 16 is shown in FIG. 1A and may be deposited to a thickness of on the order of 2.0 microns. By way of example, a two step deposition process may be utilized to deposit this layer. The first step comprises the deposition of quartz by planar sputtering using an anode bias level of 110 volts, a power level of 2.2 KW, for a period of ten minutes. This first sputter deposition is for the purpose of preventing the metal or semiconductor underneath the sputtered layer from being destroyed by resputtering. A second quartz layer is then sputtered onto the first quartz layer using an anode bias level of 430 volts, a power level of 4.4 KW, to a thickness of approximately 28000 angstroms.

The next step is to planarize this SiO₂ insulating layer 16. Typically, this planarization can be accomplished by applying a planarizing resist, and then utilizing a reactive ion etchback to obtain a planar surface. By way of example, this planarization step might comprise the application of a resist adhesion promoter, followed by the application of approximately 2 microns of a resist, such as, for example,(AZ1350J) (trademark). This resist layer would then be baked at 90° for approximately ten minutes. Then an RIE etchback would be performed. Typical parameters that may be used for the RIE etchback comprise 100 microns pressure, a gas flow rate of 50 SCCM of DE-100 (92% CF$_4$ +8% O$_2$), a power of 1350 W, with an end point stop of 3000 angstroms below the nominal quartz surface.

A layer of nitride 18 may then be deposited on to the planar surface of the insulating layer 16. Typically, this nitride will be silicon nitride to a thickness of on the order of 0.3 microns. The method of deposition may be by means of standard low temperature plasma techniques. This Si$_x$N$_y$ layer is utilized to cover any pinholes in the SiO₂ layer 16. Additionally, this silicon nitride layer in combination with the SiO₂ insulating layer operates to passivate the underlying structure. The planarized SiO₂ insulating layer 16 with the silicon nitride layer 18 thereover is shown in FIG. 1B.

The next step is to form via holes through the silicon nitride layer 18 and SiO₂ insulating layer 16 down to the conductors 10 and 12. There are a number of different techniques available in the art for forming such via holes through an insulating layer. By way of example, these via holes may be formed by standard photolithographic techniques. A typical photolithographic technique would comprise the following steps. A photoresist would be applied to a thickness which is typically in the range of 1–2 microns, and then baked for a prescribed period of time. A mask would then be formed over this photoresist layer, and the unmasked portions exposed to UV light. This photoresist layer would then be rinsed with a developer to remove portions thereof which are directly above the conductors 10 and 12. This patterned layer of photoresist 20 is shown in FIG. 1C. Holes 22 and 24 in the photoresist layer 20 are disposed directly above the conductors 10 and 12, respectively.

The next step in this process is to form the via holes through the silicon nitride layer 18 and the SiO₂ layer 16. There are a variety of etching techniques which may be utilized to form these via holes. In one embodiment, these via holes are formed by reactive ion etching. By way of example, a typical RIE step might be performed using the following parameters: a gas mixture of approximately 8% O₂, 92% CF$_4$, in a fifty micron pressure, a flow rate of 20 SCCM, a power of 1350 W, and with an overetch of 20 percent or 3000 angstroms past the endpoint. The SiO₂ insulating layer 16 with the via holes 26 and 28 therethrough is shown in FIG. 1D. The photoresist mask may then be removed by stripping in NMP 8 or O₂ plasma.

The next step in the present invention is the critical step of planar sputtering a conductive material onto the surface of the silicon nitride layer 18 and into the via holes 26 and 28. Standard prior art techniques for conductive material sputtering are known to leave voids in the via holes. In order to prevent the formation of voids and to permit the filling of via holes with aspect ratios of 1.5 or greater (height 1.5 to width 1), the present invention utilizes a high mobility sputtering process to cause the molecules of the conductive material to move until they reach their lowest energy state in the via holes. This high mobility sputtering process includes the steps of substantially eliminating non-mobile sputter species in the vicinity of the surface of the insulating layer; sputtering at a sputter pressure of less than 7 microns; maintaining a chip bias level at a value that is above that needed for planarization of the conductive material but below the bias level where material focusing into the via holes occurs; and maintaining the surface of the insulating layer 16–18 at a temperature above the temperature where conductive material planarization occurs, but below the temperature where phase changes occur for the conductive material or where device breakdown or hillock growth occurs.

In a preferred embodiment of this high mobility sputtering, the non-mobile species in the sputtering plasma are removed by maintaining a background pressure during the sputtering that is less than $10^{-7}$ torr, and preferably less than $10^{-8}$ torr. The particular non-mobile species that are eliminated by this step will depend on the type of conductive material being sputtered. By way of example, for an Al-Cu conductive material, typical non-mobile species comprise AlO$_2$, AlN$_2$, AlN$_3$.

This high-mobility sputtering requires the use of a sputter pressure of less than 7 microns, and preferably less than 5 microns in order to increase the mean free path for the various mobile conductive material species. Such an increased mean free path enhances the probability that the molecules of the conductive material will move to the bottom of deep vias.

The bias level in order to obtain this high-mobility sputtering will be determined empirically with reference to the sputtering tool being utilized. The level of the bias should be such that the sputtering gas molecules, for example argon molecules, collide with the conductive material layer already deposited on the insulating layer surface to an extent sufficient to keep the molecules of conductive material on this surface mobile until they reach their lowest energy state. Thus, this bias should be at a level to promote some moderate resputtering. This bias level is accordingly above the tool bias level required for planarization of the conductive material, but below the bias level where the material focusing into the via holes occurs. Generally, the tool biasing level to be applied to the semiconductor chip for argon sputtering of Al-Cu is in the range of −125 to −300 volts.

Finally, this high-mobility sputtering requires the maintenance of a wafer chip surface temperature such that the conductive material molecules deposited thereon continue to move until they reach their lowest energy state in the via holes, i.e., the conductive material film on the insulating layer surface is maintained at a high enough energy level to promote conductor mobility. Typically, this wafer surface temperature will be in the range of 350° C. to 500° C. However, the precise temperature to be used will depend on the type of conductive material utilized and must be determined empirically.

By way of example, and not by way of limitation, a specific set of high-mobility sputtering parameters will be set forth for sputtering Al-Cu. In this example, the insulator surface 18-16 is precleaned with, for example, a solution of 10:1 BHF-glycerine at 28° for 10 seconds. This preclean step is then followed by a rinse and dry step utilizing a 1:10 NH₄OH ambient for 10 seconds. This cleaned and rinsed and dried surface is then sputter etched for 1 minute in order to remove any residue. Al-Cu is then sputtered to a thickness of 10000 angstroms using a sputter pressure of 5 microns, a wafer bias of $-175$ volts, and a sputter power of 8 KW and a wafer temperature of approximately 450° C.

Figure 1E:
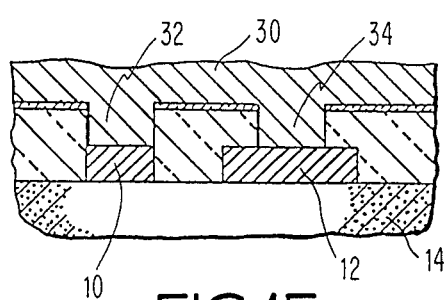
Figure 1B:
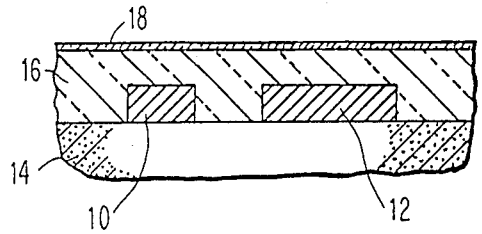

FIG. 1E shows the resulting Al-Cu layer 30 disposed over the insulating layer 18-16. FIG. 1E also shows the formation of Al-Cu studs 32 and 34 connecting to the metal conductors 10 and 12, respectively. It can be seen from the figure that there are no voids in the studs 32 and 34, and the upper surface of the Al-Cu layer 30 is substantially planar.

Figure 1F:
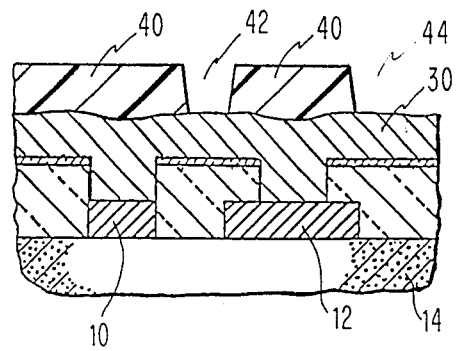
Figure 1C:
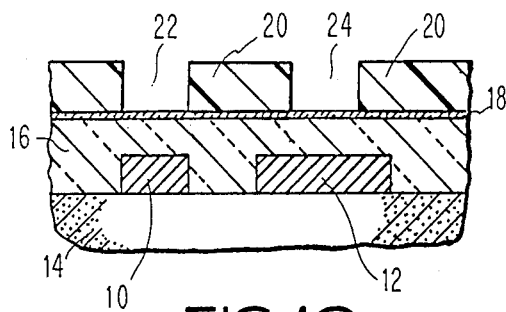

The next step in the present method comprises removing sections of the conductive material layer 30 in order to form a desired pattern of conductive material lines. This step comprises forming a mask over the sputtered surface of conductive material 30 to define the areas of sputtered conductive material to be removed. This mask formation step may again be accomplished by applying a layer of photoresist, exposing a specific pattern of that photoresist layer to UV light, developing the photoresist, and then removing the exposed photoresist areas. The resulting photoresist mask layer 40 is shown in FIG. 1F. Openings 42 and 44 in the photoresist mask 40 are formed above those portions of the conductive material layer 30 to be removed.

Following this mask formation step, the masked surface is subjected to ion beam milling to remove the conductive material in the areas defined by the mask. Ion beam milling is preferred because it permits very high line densities. Although a variety of ion beams may be utilized, it is preferred that the ions therein be inert. By way of example, this ion beam milling step could be implemented utilizing the following parameter: an angle of incidences of approximately 5 degrees from normal, an argon particle beam energy of 550 EV, and a current density of 0.75 MA-CM². By way of example, this ion beam milling step could be used to remove approximately 1.2 microns to form the openings 52 and 54 shown in FIG. 1G. These openings 52 and 54 facilitate the formation of various conductive lines in the conductive material layer 30.

Figure 1G:
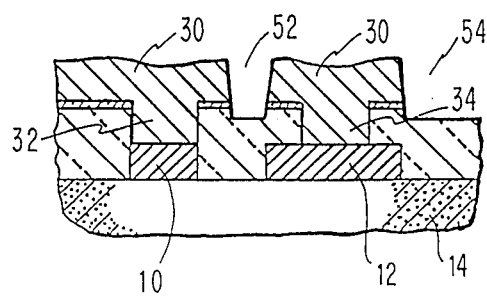
Figure 1D:
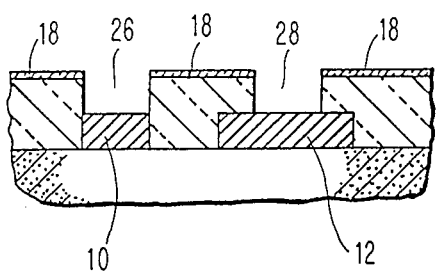

The next step in the present process is to remove the photoresist mask layers 40. By way of example, this photoresist mask 40, could be removed by means of an O₂ plasma stripping step or NMP. The resulting device with its interconnection level of patterned conductive material 30 and its intra-level via studs 32 and 34 is shown in FIG. 1G.

The above-recited steps can be repeated in order to form each subsequent level of conductive material and the via studs connecting thereto.

This inventive process can also be carried out with a polyimide insulating layer. A standard technique for forming a polyimide layer is to first preclean the underlying surface utilizing a standard cleaning agent, followed by a rinse and a dry cycle. Then the polyimide is applied in a liquid form onto this surface and spun. This spinning action flows the polyimide material over the surface of the wafer to a relatively uniform thickness. By way of example, the THERMID 600-P polyimide may be applied to a thickness of 1.5-2.0 microns. This polyimide layer is then heated to dehydrate/cure the material. With the above-noted polyimide material this curing can be accomplished by baking at 170° C. for ten minutes to remove the solvent from the polyimide, followed by a second baking cycle for 30 minutes at 250° C. to cause imidization of the polyimide, followed by a third baking cycle for one hour at 400° C. to cause the polyimide material to cross-link.

Figure 2A:
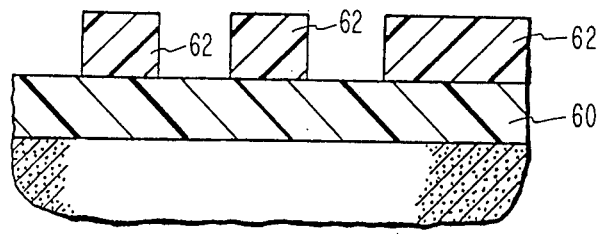
FIGS. 2A–2E comprise schematic cross-sectioned diagrams of a polyimide layer on a semiconductor chip during various stages of the process of the present invention.

Following the formation of a polyimide layer on the wafer, a standard photoresist mask is formed thereon in order to define the via holes in the polyimide. This photoresist mask may be formed by means of standard photolithographic techniques, as discussed previously. FIG. 2A shows the above-described polyimide layer 60 with a photoresist mask 62 formed thereover. By way of example, this photoresist layer may be on the order of 2.0 microns.

Figure 2B:
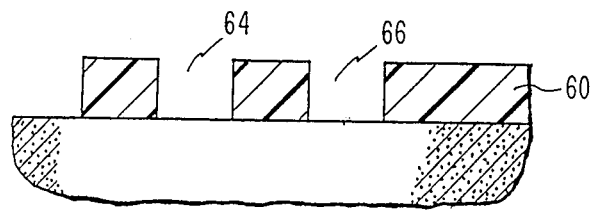

The next step in this process comprises the removal of the polyimide not covered by the photoresist mask 62. By way of example, this polyimide removal step may again be accomplished by a reactive ion etching step in O₂. The photoresist layer 62 is then removed by means of a standard stripping step, as described for the previous embodiment (NMP for 45 minutes). The resulting polyimide layer with the etched via holes 64 and 66 formed therein is shown in FIG. 2B.

Figure 2C:
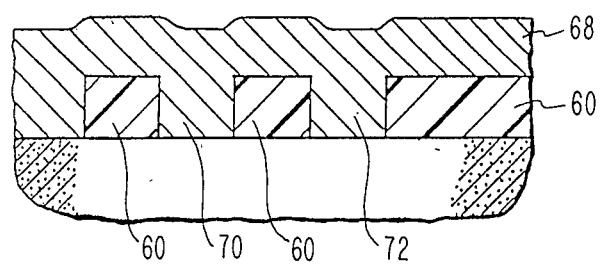
Figure 2D:
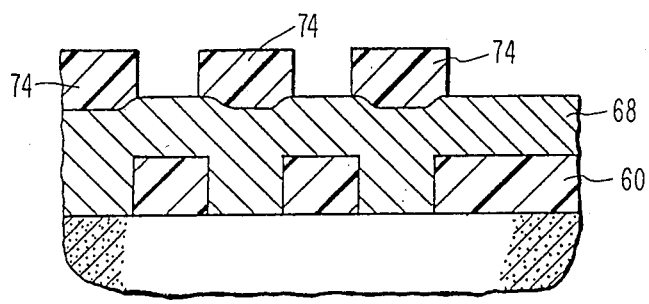

The next step in this method embodiment is to high-mobility sputter the conductive material to form the interconnection level layer and to fill the via holes 64 and 66. If the polyimide layer 60 is formed directly on a silicon wafer surface, then it may be desirable to apply a contact metallurgy into the via holes 64 and 66 to act as a barrier to prevent the interdiffusion of the conductive material and the underlying semiconductor material. By way of example, such a barrier metallurgy may be TiW or W, high-mobility sputtered to a thickness of 2000 angstroms. It is removed where unwanted simultaneously with the conductive material above it. This barrier metallurgy is then followed by the high-mobility sputtering of the desired conductive material to a desired thickness. By way of example, and not by way of limitation, an AL-Cu alloy may be sputtered to a thickness of on the order of 1.2-2.0 microns. It is understood that both of the foregoing high-mobility sputtering steps are performed utilizing specially chosen sputter parameter to enhance the mobility of the desired sputter species, as described for the previous embodiment of this process. In particular, the non-mobile sputter species concentration, the sputter pressure, the wafer chip bias level, and the wafer temperature are controlled in order to yield the previously described high-mobility sputtering process. The resulting sputtered conductive material layer is shown as layer 68 in FIG. 2C. It is again noted that the top surface of this layer 68 is substantially planar and their are no voids formed in the via studs 70 and 72.

Following this high-mobility sputtering step, the conductive layer 68 must be patterned in order to form distinct conductive lines therein. Again, this patterning may be accomplished by forming a mask 74 (see FIG. 1D) over the sputtered layer 68 in the manner described previously and then ion beam milling through this mask layer.

Figure 2E:
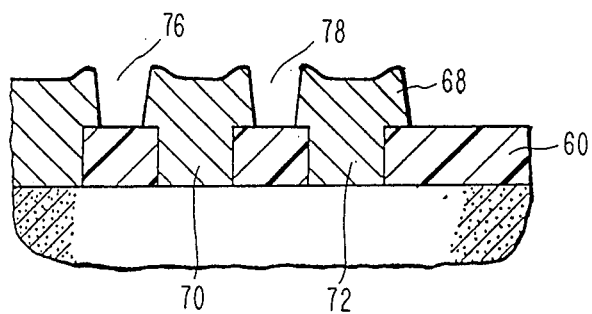

By way of example, this ion beam milling step could be set to remove a thickness equivalent to the photoresist thickness plus 3000 angstroms. The holes 76 and 78 in the conductive material layer 68 resulting from this process effectively define the conductive lines for the interconnection level. The photoresist mask 74 is then removed by stripping in NMP. The resulting wafer with its interconnection level conductive layer 68 and its via studs 70 and 72 is shown in FIG. 2E.

The foregoing steps can be repeated to form simultaneously each subsequent conductive material interconnection layer and the via studs connecting thereto.

It should be noted that with the present process, significantly higher aspect ratio via studs can be formed then in the prior art. More specifically, the prior art height/width aspect ratios were typically limited to 0.3 to 0.5 when using conventional sputtering methods. In contrast, with the present invention aspect ratios of 1.5 or greater can be obtained for via studs. Additionally, it should be noted that because the via studs are formed in an existing insulation layer, in contrast to forming the via studs and then depositing an insulation layer therearound, the spacing between via studs can be significantly reduced. Both of these aspects to the present invention facilitate higher density patterns.

The present invention with its high-mobility sputtering in combination with particle beam milling provides high resolution inter-and intra-level connections to be made simultaneously while maintaining a high degree of level planarity. Because each interconnection level formed with the present process is planarized, multi-level metallization with very small process tolerances is permitted. Additionally, because of the processing sequence and details of the present method, no alignment is necessary between $SiO_2$ and $Si_xN_y$ insulation layers, thereby improving yield capability. In particular, this process allows $Si_xN_y$ to be deposited directly on the planarized $SiO_2$, followed by the etching of vias through both parts of this composite insulation simultaneously. Current processes require a second mask step to etch through the second insulator in the composite ($Si_xN_y$).

The present process is extendable to a currently practiced semiconductor products which require one or more metallization layers. Additionally, it is extendable to substrates or wafers which are greater than 12 cm in diameter because it eliminates angle-of-incidence problems in the art.

The present invention with its simultaneous formation of interconnection levels and inter-level studs results in a significant reduction of on the order of 60 percent of the steps typically required for forming each level of interconnections for a given chip. In particular, this process reduces the number of interlevel connection defining mask steps by half, as noted above, thereby decreasing overlay problems. Likewise, this process reduces the number of tools required for forming each level of interconnections. Moreover, the present process minimizes contact of the device with corrosive chemicals.

It should be noted that the present process minimizes stud land contact problems by incorporating the studs in one continuous metal level. The process also eliminates stud damage concerns, and the self-aligned composite insulator design of the present process reduces misalignment problems, as previously discussed.

It should be noted that the present process is not restricted to the use of any lithography or resist systems, and does not require selective etches. Additionally, conductive layer levels formed using this process have a high level of heating tolerance. In this regard, existing processes typically have photoresists present during metal depositions which can not withstand temperatures greater than 250° C. However, the present process has only heat resistant insulators present during these metal depositions steps, so that the device in process can withstand temperatures in excess or 400° C. Finally, the present process permits the use of a wide range of metallurgies in its interconnection level and inter-level connections because the ion etching technique is largely mechanical in nature and invariable non-selective.

In view of the above, the present process is especially suited for high density interconnection patterns. Moreover, the process steps and process costs in forming such high density interconnection patterns are significantly reduced with this process. Additionally, this process has an improved yield capability and is extendable to wafers and substrates which are greater than 12 cm in diameter.

While the present invention has been particularly shown and described with reference to preferred embodiments therefor, it will be understood by those skilled in the art that the foregoing and other changes in form and detail may be made therein without departing from the spirit and the scope of the present invention, as defined in the appended claims.

We claim:

1. A method for forming simultaneously a level of interconnection conductors over and inter-level via studs through an insulating layer of a semiconductor chip, comprising the steps of:

forming a plurality of via holes in a surface of said insulating layer disposed on said semiconductor chip;

high-mobility sputtering a conductive material on to said surface of said insulating layer and into said via holes and including the steps of:

substantially eliminating non-mobile sputter species in the vicinity of said surface of said insulating layer;

sputtering at a sputter pressure of less than 7 microns, maintaining a chip bias level at a value that is above that needed for planarization of said conductive material but below the bias level where material focusing into the via holes occurs, and maintaining said surface of said insulating layer at a temperature above the temperature where conductive material planarization occurs, but below the temperature where phase changes occur for said conductive material or where device breakdown or hillock growth occurs;

forming a mask over said sputtered surface to define areas of sputtered conductive material to be removed; and directing a particle beam on to said masked surface to remove conductive material from said areas defined by said mask.

2. A method as defined in claim 1, wherein said non-mobile species eliminating step comprises the step of maintaining a background pressure during sputtering that is less than to $10^{-7}$ torr.

3. A method as defined in claim 1, wherein said sputtering step comprise the step of sputtering at a sputter pressure of less than 5.1 microns.

4. A method as defined in claim 1, wherein said bias level maintaining step comprises the step of maintaining said chip bias in the range of $-125$ to $-300$ volts.

5. A method as defined in claim 1, wherein, said sputtering step comprises the step of sputtering an Al alloy on to said insulating layer.

6. A method as defined in claim 1, wherein said surface temperature maintaining step comprises the step of maintaining said surface temperature at a temperature in the range of 350° C. to 500° C.; and
wherein said sputtering step comprises the step of sputtering a conductive material of an Al alloy.

7. A method as defined in claim 1, wherein said sputtering step comprises the steps of:
sputtering a layer of contact metallurgy over said insulating layer and into said via holes; and
sputtering an Al alloy on to said contact metallurgy.

8. A method as defined in claim 1, wherein said via hole forming step comprise the steps of:
forming an insulating layer of polyimide,
forming a mask over said polyimide layer to define said plurality of via holes;
etching to form said via holes in said polyimide layer; and
removing said mask.

9. A method as defined in claim 8, wherein said non-mobile species eliminating step comprises the step of maintaining a background pressure during sputtering of less than $10^{-7}$ Torr; and
wherein said sputtering step comprises the step of sputtering at a sputter pressure of less than 5.1 microns.

10. A method as defined in claim 9, wherein said bias level maintaining step comprises the step of maintaining said chip bias in the range of $-125$ to $-300$ volts.

11. A method as defined in claim 10, wherein said sputtering step comprises the step of sputtering and Al alloy on to said insulating layer.

12. A method as defined in claim 1, wherein said via hole forming step comprises the steps of:
forming an insulating layer of planar $SiO_2$;
depositing a layer of plasma nitride on to said layer of planar $SiO_2$;
forming a mask over said nitride layer;
etching to form said via holes through said nitride layer and into said layer of planar $SiO_2$; and
removing said mask.

13. A method as defined in claim 12, wherein said non-mobile species eliminating step comprises the step of maintaining a background pressure during sputtering of less than $10^{-7}$ Torr; and
wherein said sputtering step comprises the step of sputtering at a sputter pressure of less than 5.1 microns.

14. A method as defined in claim 13, wherein said bias level maintaining step comprises the step of maintaining said chip bias in the range of $-125$ to $-300$ volts.

15. A method as defined in claim 14, wherein said sputtering step comprises the step of sputtering an Al alloy on to said insulating layer.

* * * * *